(12) United States Patent
Lee et al.

(10) Patent No.: US 9,761,636 B2
(45) Date of Patent: Sep. 12, 2017

(54) IMAGE SENSORS INCLUDING SEMICONDUCTOR CHANNEL PATTERNS

(71) Applicant: Samsung Electronics Co., Ltd., Suwon-si, Gyeonggi-do (KR)

(72) Inventors: Tae-Yon Lee, Seoul (KR); Masaru Ishii, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/732,129

(22) Filed: Jun. 5, 2015

(65) Prior Publication Data

US 2016/0037098 A1 Feb. 4, 2016

(30) Foreign Application Priority Data

Jul. 31, 2014 (KR) .................... 10-2014-0098249

(51) Int. Cl.
| | | |
|---|---|---|
| H01L 29/04 | (2006.01) | |
| H01L 29/10 | (2006.01) | |
| H01L 31/00 | (2006.01) | |
| H01L 27/30 | (2006.01) | |

(52) U.S. Cl.
CPC ................................ *H01L 27/307* (2013.01)

(58) Field of Classification Search
CPC .................................................... H01L 27/307
USPC ..................................................... 257/40, 59
See application file for complete search history.

(56) References Cited

U.S. PATENT DOCUMENTS

| | | | | |
|---|---|---|---|---|
| 5,418,387 A | * | 5/1995 | Nakamura | ........ H01L 27/14893 |
| | | | | 257/222 |
| 6,091,382 A | * | 7/2000 | Shioya | ................. G09G 3/3216 |
| | | | | 313/504 |
| 6,307,218 B1 | * | 10/2001 | Steigerwald | ............ H01L 33/38 |
| | | | | 257/94 |
| 7,016,214 B2 | * | 3/2006 | Kawamata | .......... G11C 11/4087 |
| | | | | 257/369 |
| 7,671,386 B2 | * | 3/2010 | Kuriyama | ......... H01L 27/14831 |
| | | | | 257/239 |

(Continued)

FOREIGN PATENT DOCUMENTS

| | | |
|---|---|---|
| JP | 2011187544 A | 9/2011 |
| JP | 2012-191222 | 10/2012 |

(Continued)

OTHER PUBLICATIONS

Ihama et al. "CMOS Image Sensor with an Overlaid Organic Photoelectric Conversion Layer: Optical Advantages of Capturing Slanting Rays of Light", FUJIFILM Corporation, pp. 33-36, 2014.

*Primary Examiner* — Lex Malsawma
*Assistant Examiner* — Eric Jones
(74) *Attorney, Agent, or Firm* — Ward and Smith, P.A.

(57) ABSTRACT

The inventive concepts relate to image sensors. The image sensor includes a substrate including a floating diffusion region and a pixel circuit, an interlayer insulating layer on the substrate, a contact node and a first electrode on the interlayer insulating layer, a dielectric layer on a top surface of the first electrode, a channel semiconductor pattern on the dielectric layer and connected to the contact node, and a photoelectric conversion layer on the channel semiconductor pattern. The channel semiconductor pattern includes a semiconductor material having an electron mobility that is higher than an electron mobility of the photoelectric conversion layer.

9 Claims, 16 Drawing Sheets

(56) References Cited

U.S. PATENT DOCUMENTS

| | | | | |
|---|---|---|---|---|
| 8,269,302 | B2* | 9/2012 | Tian | H01L 27/14603 257/440 |
| 8,552,415 | B2 | 10/2013 | Toda | |
| 8,698,064 | B2* | 4/2014 | Otake | H01L 27/14623 250/208.1 |
| 8,704,924 | B2* | 4/2014 | Watanabe | H04N 5/228 257/431 |
| 8,835,924 | B2* | 9/2014 | Gidon | H01L 27/14636 257/53 |
| 8,836,839 | B2 | 9/2014 | Choo et al. | |
| 9,344,654 | B2* | 5/2016 | Ishii | H04N 5/3698 |
| 2005/0264662 | A1* | 12/2005 | Suzuki | H01L 27/14603 348/294 |
| 2006/0092299 | A1* | 5/2006 | Suzuki | H04N 5/335 348/294 |
| 2007/0012955 | A1* | 1/2007 | Ihama | H01L 27/14621 257/233 |
| 2007/0205477 | A1* | 9/2007 | Yokoyama | H01L 27/14647 257/429 |
| 2007/0279661 | A1* | 12/2007 | Misawa | H01L 27/14632 358/1.9 |
| 2008/0035965 | A1* | 2/2008 | Hayashi | H01L 27/14647 257/291 |
| 2008/0055443 | A1* | 3/2008 | Okamoto | H01L 27/14647 348/298 |
| 2009/0107539 | A1* | 4/2009 | Musha | B82Y 10/00 136/244 |
| 2010/0012189 | A1* | 1/2010 | Sakai | B82Y 10/00 136/261 |
| 2010/0187501 | A1* | 7/2010 | Toda | B82Y 20/00 257/21 |
| 2011/0049665 | A1* | 3/2011 | Goto | H01L 27/307 257/459 |
| 2011/0115003 | A1* | 5/2011 | Okita | H01L 27/14632 257/291 |
| 2011/0149104 | A1* | 6/2011 | Mabuchi | H01L 27/14609 348/222.1 |
| 2011/0180688 | A1* | 7/2011 | Nakahara | H01L 21/02425 250/208.1 |
| 2011/0272772 | A1* | 11/2011 | Kokubun | H01L 27/14632 257/432 |
| 2012/0098028 | A1* | 4/2012 | Naito | H01L 51/0036 257/103 |
| 2012/0161270 | A1* | 6/2012 | Maehara | B82Y 10/00 257/432 |
| 2012/0167972 | A1* | 7/2012 | Tseng | H01L 51/447 136/256 |
| 2012/0211082 | A1* | 8/2012 | Akiyama | C07F 9/5325 136/263 |
| 2012/0249829 | A1 | 10/2012 | Izuha et al. | |
| 2012/0305899 | A1* | 12/2012 | Taki | C08G 61/126 257/40 |
| 2013/0009138 | A1 | 1/2013 | Seo et al. | |
| 2013/0075620 | A1* | 3/2013 | Nishino | A61B 6/548 250/394 |
| 2013/0087682 | A1* | 4/2013 | Nomura | C09B 23/105 250/206 |
| 2013/0093911 | A1* | 4/2013 | Sul | H01L 27/307 348/222.1 |
| 2013/0093932 | A1* | 4/2013 | Choo | H01L 51/424 348/294 |
| 2013/0335610 | A1* | 12/2013 | Yamada | H04N 5/351 348/308 |
| 2014/0000716 | A1* | 1/2014 | Eu | H01L 51/0036 136/263 |
| 2014/0001454 | A1* | 1/2014 | Miyanami | H01L 27/286 257/40 |
| 2014/0131828 | A1* | 5/2014 | Isono | H01L 27/14636 257/459 |
| 2015/0303398 | A1* | 10/2015 | Ii | H01L 51/442 257/40 |

FOREIGN PATENT DOCUMENTS

| | | | | |
|---|---|---|---|---|
| JP | 2013-258168 | | 12/2013 | |
| KR | 1005455090000 | | 1/2006 | |
| KR | 1020100088077 | A | 8/2010 | |
| KR | 1020120112016 | A | 10/2012 | |
| KR | 1020130040439 | A | 4/2013 | |
| WO | WO 2011148574 | A1 | 12/2011 | |
| WO | WO2014/112279 | A1* | 7/2014 | H01L 27/146 |

* cited by examiner

IMAGE SENSORS INCLUDING SEMICONDUCTOR CHANNEL PATTERNS

CROSS-REFERENCE TO RELATED APPLICATION

This U.S. non-provisional patent application claims priority under 35 U.S.C. §119 to Korean Patent Application No. 10-2014-0098249, filed on Jul. 31, 2014, in the Korean Intellectual Property Office, the disclosure of which is hereby incorporated by reference in its entirety.

BACKGROUND

Example embodiments of the inventive concepts relate to image sensors. More particularly, the inventive concepts relate to complementary metal-oxide-semiconductor (CMOS) image sensors with improved performance.

An image sensor is a semiconductor device that converts an optical image into electrical signals. Image sensors may be categorized as any one of charge coupled device (CCD) image sensors and CMOS image sensors (CIS). A CIS typically includes a plurality of two-dimensionally arranged pixels. Each of the pixels may include a photodiode that converts incident light into an electrical signal. CIS pixels may suffer from crosstalk, which occurs when light incident on one pixel affects the level of Tight detected at a different pixel. CIS pixels may also suffer from dark current, which can cause a pixel to register a value in the absence of incident light, and reset noise, which can cause a pixel to continue to register a value after the pixel has been reset.

SUMMARY

Example embodiments of the inventive concepts may provide highly integrated image sensors capable of reducing or minimizing a dark current.

Example embodiments of the inventive concepts may also provide highly integrated image sensors capable of reducing or minimizing reset noise or kTC noise.

Example embodiments of the inventive concepts may also provide highly integrated image sensors capable of reducing or minimizing crosstalk.

According to an example embodiment of the inventive concepts, an image sensor may include: a substrate including a floating diffusion region and a pixel circuit; an interlayer insulating layer on the substrate; a contact node and a first electrode on the interlayer insulating layer; a dielectric layer on a top surface of the first electrode; a channel semiconductor pattern on the dielectric layer and connected to the contact node; and a photoelectric conversion layer on the channel semiconductor pattern. The channel semiconductor pattern may include a semiconductor material having an electron mobility that is higher than an electron mobility of the photoelectric conversion layer.

The contact layer may be thicker than the first electrode. The dielectric layer may extend between the contact node and the first electrode.

In an example embodiment, a conduction band energy level of the channel semiconductor pattern may be lower than a conduction band energy level of the photoelectric conversion layer, and a valence band energy level of the channel semiconductor pattern may be lower than a valence band energy level of the photoelectric conversion layer.

In an example embodiment, the channel semiconductor pattern may include at least one of InGaZnO, ZnO, $SnO_2$, CdSe, CdS, or $MoS_2$.

In an example embodiment, the image sensor may further include: a via-plug disposed in the interlayer insulating layer. The via-plug may electrically connect the floating diffusion region to the contact node. The image sensor may also include a second electrode on the photoelectric conversion layer.

In an example embodiment, the image sensor may further include: an isolation insulating pattern on the dielectric layer. The isolation insulating pattern may be in contact with sidewalls of the channel semiconductor pattern and may surround the channel semiconductor pattern when viewed from a plan view.

In an example embodiment, the photoelectric conversion layer may include an electron donating organic material and an electron accepting organic material, and the organic materials may constitute a hulk hetero junction-type PN junction structure.

In an example embodiment, the contact node may overlap with a central portion of the channel semiconductor pattern when viewed from a plan view, and the first electrode may surround an entire periphery of the contact node when viewed from a plan view.

In an example embodiment, the contact node may be adjacent to one edge of the channel semiconductor pattern or a corner between adjacent edges of the channel semiconductor pattern when viewed from a plan view, and the first electrode may surround a portion of a sidewall of the contact node when viewed from a plan view.

In an example embodiment, the image sensor may further include: an isolation insulating pattern disposed on the interlayer insulating layer. The isolation insulating pattern may be in contact with sidewalls of the dielectric layer and sidewalls of the channel semiconductor pattern and may surround the dielectric layer and the channel semiconductor pattern when viewed from a plan view.

In an example embodiment, the image sensor may further include: a guard electrode disposed on the interlayer insulating layer. The guard electrode may surround the contact node and the first electrode when viewed from a plan view, and the dielectric layer may extend between the contact node and the first electrode and between the first electrode and the guard electrode.

According to another example embodiment of the inventive concepts, an image sensor may include: a substrate including a floating diffusion region and a pixel circuit; an interlayer insulating layer on the substrate; a storage transfer element on the interlayer insulating layer; and a photoelectric conversion element on the storage transfer element. The photoelectric conversion element may include: a photoelectric conversion layer selectively absorbing light of a visible wavelength band to convert, the absorbed light into an electrical signal, and the storage transfer element may include: a channel semiconductor pattern storing and transferring electrons generated in the photoelectric conversion layer.

In an example embodiment, the channel semiconductor pattern may include a semiconductor material of which electron mobility is higher than that of the photoelectric conversion layer.

In an example embodiment, the channel semiconductor pattern may include at least one of InGaZnO, ZnO, $SnO_2$, CdSe, CdS, or $MoS_2$.

In an example embodiment, the storage transfer element may further include: a first electrode on the interlayer insulating layer; and a dielectric layer disposed on the interlayer insulating layer and covering a top surface of the first electrode. In this case, the channel semiconductor pattern may be disposed on the dielectric layer.

In an example embodiment, the image sensor may further include: a via-plug disposed in the interlayer insulating layer and connected to the floating diffusion region; and a contact node disposed on the interlayer insulating layer. The contact node may penetrate the dielectric layer so as to be connected to the via-plug and the channel semiconductor pattern.

In an example embodiment, the image sensor may further include: an isolation insulating pattern on the dielectric layer. The isolation insulating pattern may be in contact with sidewalls of the channel semiconductor pattern and may surround the channel semiconductor pattern when viewed from a plan view.

According to still another example embodiment of the inventive concepts, an image sensor may include: a substrate including a floating diffusion region and a pixel circuit; an interlayer insulating layer disposed on the substrate and including a via-plug connected to the floating diffusion region; a contact node disposed on the interlayer insulating layer and connected to the via-plug; a first electrode disposed on the interlayer insulating layer and surrounding at least a portion of a sidewall of the contact node; a dielectric layer covering a top surface of the first electrode and extending between the contact node and the first electrode; a channel semiconductor pattern disposed on the dielectric layer and connected to the contact node; a photoelectric conversion layer disposed on the channel semiconductor pattern and selectively absorbing light of a visible wavelength band to convert the absorbed light into an electrical signal; and a second electrode on the photoelectric conversion layer. The channel semiconductor pattern may store electrons generated in the photoelectric conversion layer and may transfer the stored electrons to the contact node.

In an example embodiment, the channel semiconductor pattern may include a semiconductor material of which electron mobility is higher than that of the photoelectric conversion layer.

In an example embodiment, the channel semiconductor pattern may include at least one of InGaZnO, ZnO, $SnO_2$, CdSe, CdS, or $MoS_2$.

In an example embodiment, the image sensor may further include: an isolation insulating pattern on the dielectric layer. The isolation insulating pattern may be in contact with sidewalls of the channel semiconductor pattern and may surround the channel semiconductor pattern when viewed from a plan view.

Some example embodiments of the inventive concepts provide an image sensor including an insulating layer, a contact node and a first electrode on the insulating layer, wherein the contact node and the first electrode are spaced apart from one another, and a dielectric layer on a top surface of the first electrode opposite the insulating layer. A channel semiconductor pattern is on the dielectric layer and is connected to the contact node. The channel semiconductor pattern is isolated from the contact node by the dielectric layer. The image sensor further includes a photoelectric conversion layer on the channel semiconductor pattern. The channel semiconductor pattern includes a semiconductor material having a conduction band energy level that is lower than a conduction band energy level of the photoelectric conversion layer.

BRIEF DESCRIPTION OF THE DRAWINGS

Example embodiments of the inventive concepts will become more apparent in view of the attached drawings and accompanying detailed description.

DETAILED DESCRIPTION

Figure 1:
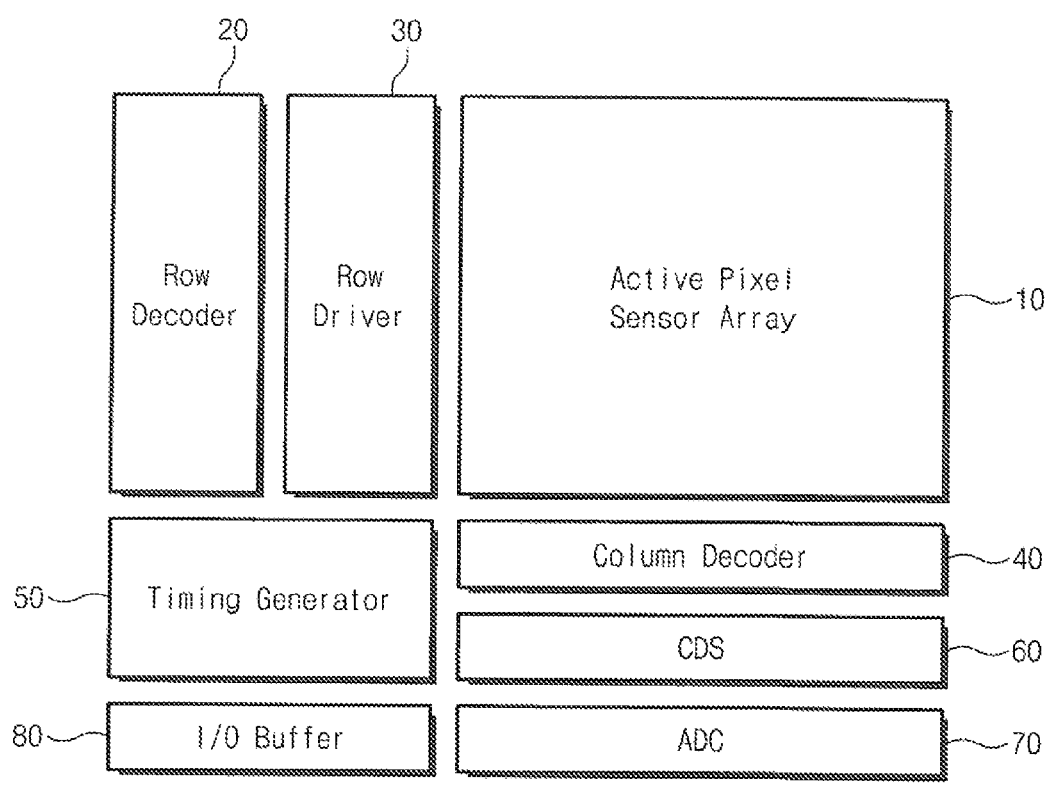
FIG. 1 illustrates a schematic block diagram of an image sensor according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an"

and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 illustrates a schematic block diagram of an image sensor according to example embodiments of the inventive concepts. FIG. 1 illustrates a complementary metal-oxide-semiconductor (CMOS) image sensor. However, the inventive concepts are not limited to the CMOS image sensor.

Referring to FIG. 1, the image sensor may include an active pixel sensor array 10, a row decoder 20, a row driver 30, a column decoder 40, a timing generator 50, a correlated double sampler (CDS) 60, an analog-to-digital converter (ADC) 70, and an input/output (I/O) buffer 80.

The active pixel sensor array 10 may include a plurality of two-dimensionally arranged unit pixels and may convert optical signals into electrical signals. The active pixel sensor array 10 may be driven by a plurality of driving signals provided from the row driver 30. For example, the driving signals may include a pixel selection signal, a reset signal, and a charge transfer signal. The converted electrical signals may be provided to the correlated double sampler 60.

The row driver 30 may provide the driving signals for driving a plurality of unit pixels to the active pixel sensor array 10 according to results decoded in the row decoder 20. When the unit pixels are arranged in a matrix form including rows and columns, the driving signals may be provided to each row.

The timing generator 50 may provide a timing signal and a control signal to the row decoder 20 and the column decoder 40.

The correlated double sampler 60 may receive the electrical signals generated from the active pixel sensor array 10 and may hold and sample the received electrical signals. The correlated double sampler 60 may doubly sample a specific noise level and a signal level of the electrical signal to output a difference level corresponding to a difference between the noise level and the signal level.

The analog-to-digital converter 70 may convert an analog signal corresponding to the difference level outputted from the correlated double sampler 60 into a digital signal and may output the digital signal.

The I/O buffer 80 may latch the digital signals, and the latched digital signals may be sequentially outputted as digital signals to an image signal processing part (not shown) in response to results decoded in the column decoder 40.

Figure 2:
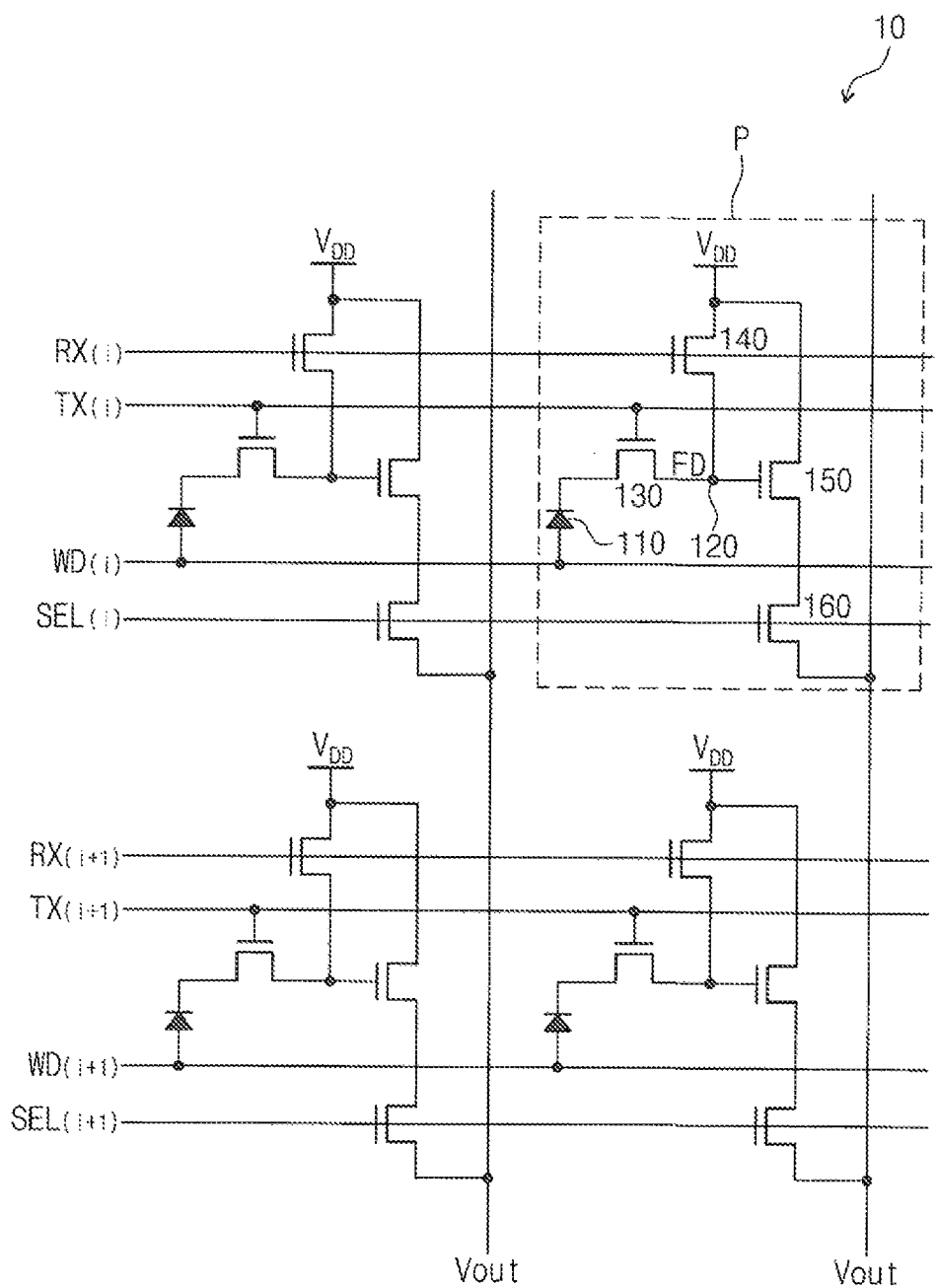
FIG. 2 illustrates a circuit diagram of an active pixel sensor array of an image sensor according to example embodiments of the inventive concepts.

FIG. 2 illustrates a circuit diagram of an active pixel sensor array of an image sensor according to example embodiments of the inventive concepts.

Referring to FIG. 2, the active pixel sensor array 10 may include a plurality of unit pixels P arranged in a matrix form. In an example embodiment, each of the unit pixels P may include a photoelectric conversion element 110, a storage transfer element 130, and a sensing part. The sensing part may include a reset element 140, an amplification element 150, and a selection element 160.

The photoelectric conversion element 110 may generate photo-charges corresponding to incident light. For example, the photoelectric conversion element 110 may include a photo diode, a photo transistor, a photo gate, a pinned photo diode (PPD), or any combination thereof. A desired voltage may be applied to the photoelectric conversion element 110. This may be controlled by a row driving line WD (i). In an example embodiment, an organic photo diode may be used as the photoelectric conversion element 110. The photoelectric conversion element 110 may be connected to the storage transfer element 130. The storage transfer element 130 may accumulate the photo-charges generated in the photoelectric conversion element 110 and may transfer the accumulated photo-charges to a detection element 120. The storage transfer element 130 may generally have a gate electrode of one MOS transistor and may be controlled by a charge transfer signal line TX (i). In addition, the storage transfer element 130 according to the inventive concepts may function as a MOS capacitor (MOSCAP) during the operation of accumulating the photo-charges.

The detection element 120 may be a floating diffusion region FD that is formed in a semiconductor layer and is doped with N-type dopants. The detection element 120 may receive the photo-charges by the storage transfer element 130 and may cumulatively store the received photo-charges. The detection element 120 may be electrically connected to the amplification element 150 to control the amplification element 150.

The reset element 140 may reset the detection element 120 by draining charges from the detection element 120 and may be realized by one NMOS transistor. A source of the reset element 140 realized by the one NMOS transistor may be connected to the detection element 120, and a drain of the reset element 140 may be connected to a power voltage $V_{DD}$. The reset element 140 may be driven by a bias provided through a reset signal line RX (i). If the reset element 140 is turned-on by the bias provided through the reset signal line RX (i), the power voltage $V_{DD}$ connected to the drain of the reset element Rx may be transmitted to the detection element 120. Thus, the detection element 120 may be reset when the reset element 140 is turned-on.

The amplification element 150 may be combined with a constant current source (not shown) located outside the unit pixel P to act as a source follower buffer amplifier. The amplification element 150 may amplify a variation of an electrical potential of the detection element 120 and may output the amplified potential variation to an output line Vout.

The selection element 160 may select a unit cell to be sensed. In an example embodiment, signals of all the pixels of one row may be sensed at the same time. The selection element 160 may be driven by a bias provided through a row selection line SEL (i). If the selection element 160 is turned-on, the power voltage $V_{DD}$ connected to a drain of the amplification element 150 may be transmitted to a drain of the selection element 160 depending on the state of the amplification element 150 which in turn depends on the amount of charge accumulated in the floating diffusion region FD.

Figure 4:
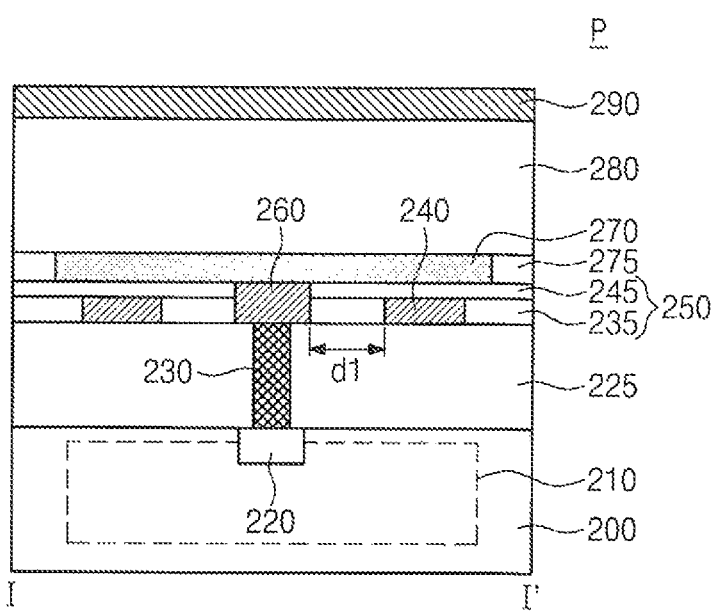
FIG. 4 illustrates a cross-sectional view taken along a line I-I' of FIG. 3.

According to example embodiments of the inventive concepts, the detection element 120, the reset element 140, the amplification element 150, and the selection element 160 may be realized as a form of a pixel circuit 210 of FIG. 4, like a general CMOS image sensor. On the other hand, the photoelectric conversion element 110 and the storage transfer element 130 may be realized in a separate region divided from the elements 120, 140, 150, and 160.

The driving signal lines WD (i), TX (i), RX (i), and SEL (i) of the photoelectric conversion element 110, the storage transfer element 130, the reset element 140, and the selection element 160 may extend in a row direction (e.g., a horizontal direction) to drive the unit pixels P included in the same row at the same time.

Figure 3:
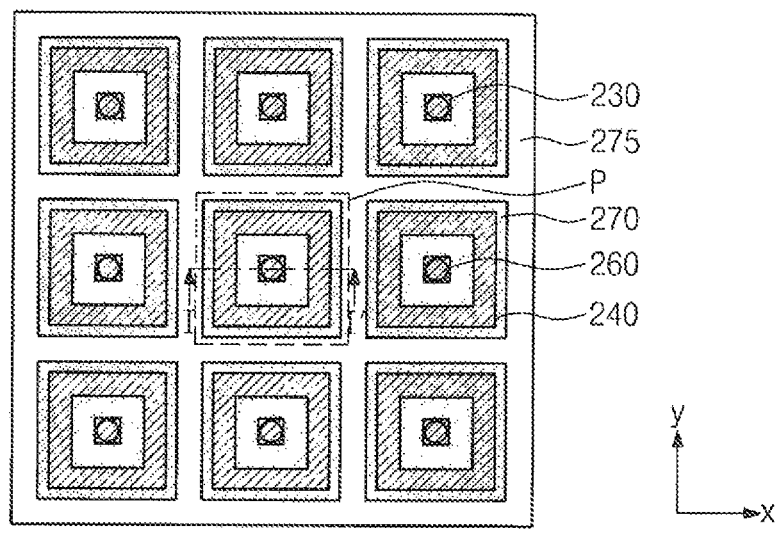
FIG. 3 illustrates a plan view of an active pixel sensor array of an image sensor according to an example embodiment of the inventive concepts.
Figure 5:
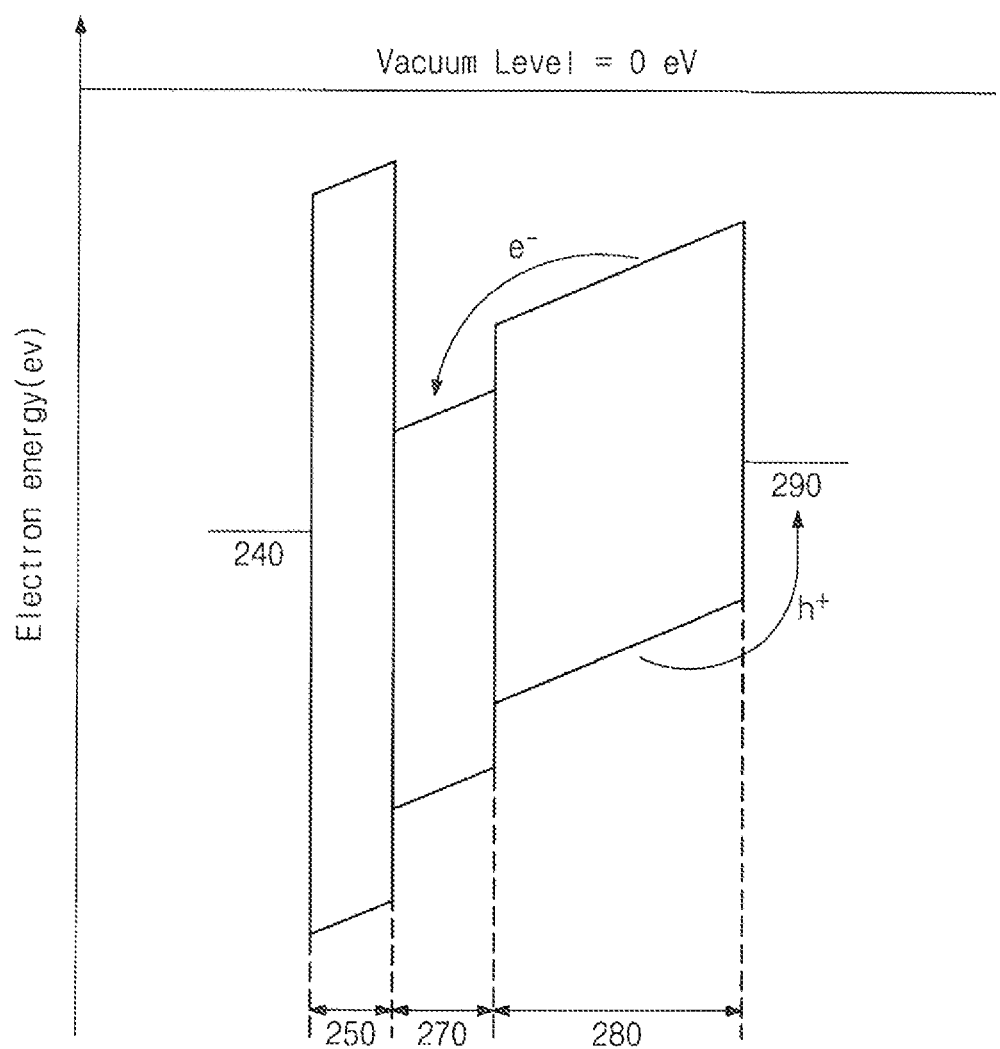
FIG. 5 illustrates a schematic energy band diagram for explaining a method of operating an image sensor according to an example embodiment of the inventive concepts.

FIG. 3 illustrates a plan view of an active pixel sensor array of an image sensor according to an example embodiment of the inventive concepts, and FIG. 4 is a cross-sectional view take along a line I-I' of FIG. 3. FIG. 5 illustrates a schematic energy band diagram of band energy levels within an image sensor according to an example embodiment of the inventive concepts. In FIGS. 3, 4, and 5, some elements may be omitted for the purpose of ease and convenience in explanation.

Referring to FIGS. 3 and 4, a substrate 200 may be provided. The substrate 200 may include a plurality of two-dimensionally arranged unit pixels P. The substrate 200 may be, but not limited to, a silicon substrate, a silicon-germanium substrate, or a compound semiconductor substrate. The substrate 200 may be doped with, for example, P-type dopants.

Each of the unit pixels P may include a pixel circuit 210. The pixel circuit 210 may include the reset element, the amplification element, and the selection element described with reference to FIG. 2. In addition, each of the unit pixels P may include a floating diffusion region 220 that is formed in the substrate 200. The floating diffusion region 220 may be doped with N-type dopants. The floating diffusion region 220 may correspond to the detection element described with reference to FIG. 2. Hereinafter, one unit pixel P will be described as an example for the purpose of ease and convenience in explanation.

An interlayer insulating layer 225 may be disposed on the substrate 200 including the pixel circuit 210 and the floating diffusion region 220. The interlayer insulating layer 225 may be single-layered or multi-layered. The interlayer insulating layer 225 may include at least one of an oxide (e.g., silicon oxide), a nitride (e.g., silicon nitride), or an oxynitride (e.g., silicon oxynitride). A via-plug 230 may be disposed in the interlayer insulating layer 225 so as to be connected to the floating diffusion region 220. In an example embodiment, the via-plug 230 may be shaped like, but not limited to a circular cylinder or a polygonal pillar. The via-plug 230 may electrically connect the floating diffusion region 220 to a contact node 260 to be described later. For example, the via-plug 230 may include at least one of a metal material (e.g., copper, aluminum, or tungsten), polysilicon, and silicon heavily doped with dopants.

The contact node 260 and a first electrode 240 may be disposed on the interlayer insulating layer 225. The contact node 260 is connected to the via-plug 230. A horizontal section of the contact node 260 may have, but not limited to, a circular shape or a polygonal shape. In an example embodiment, the horizontal section of the contact node 260 may have a quadrilateral shape. The first electrode 240 may surround an entire periphery of the contact node 260 by at least a predetermined distance therebetween when viewed from a plan view. A horizontal section of the first electrode 240 may be shaped like a circular ring or polygonal ring corresponding to the shape of the horizontal section of the contact node 260. For example, if the horizontal section of the contact node 260 has the quadrilateral shape, the horizontal section of the first electrode 240 may have a quadrilateral ring shape. In this case, each of the inner sidewalk of the first electrode 240 may face each of sidewalls of the contact node 260. The inner sidewall of the first electrode 240 and the sidewall of the contact node 260, which face each other, may be spaced apart from each other by a first distance d1. The contact node 260 may be thicker than the first electrode 240 in a vertical direction, e.g. away from the substrate 200. In other words, a top surface of the contact node 260 may be higher above the substrate than a top surface of the first electrode 240. In addition, an area of the top surface of the contact node 260 may be smaller than that of the top surface of the first electrode 240. The area of the contact node 260, the area of the first electrode 240, and the distance therebetween may be variously modified as necessary.

The first electrode 240 may include a metal material such as aluminum or tungsten. In this case, the first electrode 240 may have a thickness of about 20 nm or less so that the first electrode 240 may be transparent. In other embodiments, the first electrode 240 may include at least one selected from a group consisting of indium tin oxide (ITO), indium zinc oxide (IZO), zinc oxide (ZnO), tin oxide ($SnO_2$), antimony-doped tin oxide (ATO), aluminum-doped zinc oxide (AZO), gallium-doped zinc oxide (GZO), titanium oxide ($TiO_2$), and fluorine-doped tin oxide (FTO). The contact node 260 may include the same material as the first electrode 240.

A dielectric layer 250 may be disposed on the interlayer insulating layer 225 to cover the top surface of the first electrode 240. The dielectric layer 250 may include a lower dielectric layer 235 and an upper dielectric layer 245 disposed on the lower dielectric layer 235. The lower dielectric layer 235 may extend onto sidewalk of a lower portion of the contact node 260 and sidewalls of the first electrode 240. In an example embodiment, the lower dielectric layer 235 may cover sidewalk of a lower portion of the contact node 260 and sidewalk of the first electrode 240. The upper dielectric layer 245 may cover the top surface of the first electrode 240. Here, the lower portion of the contact node 260 may be defined as a portion of the contact node 260 that is disposed between a level of a bottom surface of the contact node 260 and a level of the top surface of the lower dielectric layer 235. A top surface of the lower dielectric layer 235 may be disposed at a substantially same height as the top surface of the first electrode 240. The upper dielectric layer 245 may cover sidewalls of an upper portion of the contact node 260 that are exposed by the lower dielectric layer 235. A top surface of the upper dielectric layer 245 may be substantially coplanar with the top surface of the contact node 260. The lower dielectric layer 235 and the upper dielectric layer 245 may include the same material. In an example embodiment, the lower and upper dielectric layers 235 and 245 may include silicon oxide, silicon nitride, or silicon oxynitride. In other embodiments, the lower and upper dielectric layers 235 and 245 may include a high-k dielectric material such as hafnium oxide or aluminum oxide.

A channel semiconductor pattern 270 may be disposed on the dielectric layer 250 so as to be connected to the contact node 260. The channel semiconductor pattern 270 may cover the contact node 260 and the first electrode 240 when viewed from a plan view. In other words, the contact node 260 and the first electrode 240 may be disposed under the channel semiconductor pattern 270. An area of a top surface of the channel semiconductor pattern 270 may be greater than a sum of those of the contact node 260 and the first electrode 240. In an example embodiment, a horizontal section of the channel semiconductor pattern 270 may have a quadrilateral shape. However, the inventive concepts are not limited thereto. In an example embodiment) the contact node 260 may be disposed under a central portion of the channel semiconductor pattern 270, and the first electrode 250 may surround the contact node 260. The electrode 240, the channel semiconductor pattern 270, and the dielectric layer 250 interposed therebetween may correspond to the storage transfer element described with reference to FIG. 2. In an example embodiment, the first electrode 240 may function as a gate of the storage transfer element. Even though not shown in the drawings, a metal interconnection connected to the first electrode 240 may be disposed in the interlayer insulating layer 225. A desired voltage may be applied to the first electrode 240 through the metal interconnection.

The channel semiconductor pattern 270 may include a material having an electron mobility that is higher than the electron mobility of an organic photoelectric conversion layer 280 to be described later. Also, the channel semiconductor pattern 270 may include a material having a conduction band energy level and a valence band energy level that are lower than a conduction band energy level and a valence band energy level of the organic photoelectric conversion layer 280, respectively, as illustrated in FIG. 5. In an example embodiment, the channel semiconductor pattern 270 may include a transparent conductive oxide semiconductor material such as InGaZnO, ZnO, or $SnO_2$. In other embodiments, the channel semiconductor pattern 270 may include a II-VI group compound semiconductor material such as CdSe or CdS. In still other embodiments, the channel semiconductor pattern 270 may include a semiconductor material such as $MoS_2$. The channel semiconductor pattern 270 may have a high electron mobility of 200 $cm^2$/Vs to 900 $cm^2$/Vs, and a transmittance of 80% or more in a visible wavelength band.

An isolation insulating pattern 275 may be disposed on the dielectric layer 250. The isolation insulating pattern 275 may be in contact with sidewalls of the channel semiconductor pattern 270 and may surround the channel semiconductor pattern 270. The isolation insulating pattern 275 may electrically isolate the channel semiconductor pattern 270 of the unit pixel P from channel semiconductor patterns 270 of neighboring unit pixels P. The isolation insulating pattern 275 may include at least one of an oxide (e.g., silicon oxide), a nitride (e.g., silicon nitride), or an oxynitride), (e.g., silicon oxynitride). When viewed from a plan view, the isolation insulating pattern 275 may have a grid shape. In other words, the isolation insulating pattern 275 may include a plurality of rows extending in a first direction and a plurality of columns extending in a second direction intersecting the first direction. The isolation insulating pattern 275 may define the unit pixel P.

The organic photoelectric conversion layer 280 may be disposed on the substrate 200 having the channel semiconductor pattern 270 and the isolation insulating pattern 275. The organic photoelectric conversion layer 280 may correspond to the photoelectric conversion element described with reference to FIG. 2. The organic photoelectric conversion layer 280 may cover the plurality of unit pixels P. The organic photoelectric conversion layer 280 may have the energy band diagram alignment illustrated in FIG. 5. Although an organic photoelectric conversion layer is illustrated, other types of photoelectric conversion layers, such as PN junctions, may be used.

According to some example embodiments, the organic photoelectric conversion layer 280 may include a mixed organic material including an electron donating organic material and an electron accepting organic material. In other words, the organic photoelectric conversion layer 280 may include a mixed organic material including an N-type organic material corresponding to the electron donating organic material and a P-type organic material corresponding to the electron accepting organic material. Thus, the organic photoelectric conversion layer 280 may have a bulk hetero junction-type PN junction structure. The organic photoelectric conversion layer 280 may selectively absorb light of a specific wavelength hand to cause the photoelectric conversion. The organic photoelectric conversion layer 280 may be applied to a blue pixel, a green pixel, and/or a red pixel. In an example embodiment, the organic photoelectric conversion layer 280 may include a mixture of coumarin 30:C60 and tris(8-hydroxyquinolinato)aluminum (Alq3), which is used as an organic material causing the photoelectric conversion of light in a blue wavelength band. In other embodiments, the organic photoelectric conversion layer 280 may include a mixture of boron subphthalocyanine chloride (SubPc) and N,-N dimethyl quinacridone (DMQA) dibutyl-substituted dicyanovinyl-terthiophene (DCV3T), which is used as an organic material causing the photoelectric conversion of light in a green wavelength band. In still other embodiments, the organic photoelectric conversion layer 280 may include a mixture of zinc phthalocyanine (ZnPc), titanyl-oxo-phthalocyanine (TiOPc), and Alq3, which is used as an organic material causing the photoelectric conversion of light in a red wavelength band.

A second electrode 290 may be disposed on the organic photoelectric conversion layer 280. The second electrode 290 may cover the plurality of unit pixels P. The second electrode 290 may be formed of a transparent conductive oxide. For example, the second electrode 290 may include at least one selected from a group consisting of indium tin oxide (ITO), indium zinc oxide (IZO), zinc oxide (ZnO), tin oxide ($SnO_2$) antimony-doped tin oxide (ATO), aluminum-doped zinc oxide (AZO), gallium-doped zinc oxide (OZO), titanium oxide ($TiO_2$), and fluorine-doped tin oxide (FTO).

A method of operating the image sensor according to example embodiment will be described with reference to FIGS. 3 to 5.

First, a power voltage $V_{DD}$ may be applied to the drain of the reset element and the drain of the amplification element in a dark state, thereby discharging charges remaining in the floating diffusion region 220. Next, the reset element may be turned-off if external light is incident on the organic photoelectric conversion layer 280, mobile charge carriers in the form of electron-hole pairs (EHP) are generated in the organic photoelectric conversion layer 280. At this time the contact node 260 may be in a constant voltage level (i.e., a positive voltage level) due to the drain of the reset element.

After the reset element is turned-off, a voltage higher than the voltage of the contact node 260 may be applied to the first electrode 240 and a negative voltage may be applied to the second electrode 290. Thus, photo-charges (e.g., electrons) generated in the organic photoelectric conversion layer 280 may move toward the first electrode 240. At the same time, holes may move to the second electrode 290. As illustrated in FIG. 5, since the channel semiconductor pattern 270 includes a material having a conduction band energy level that is lower than a conduction band energy of the organic photoelectric conversion layer 280, the electrons generated in the organic photoelectric conversion layer 280 may move freely into the channel semiconductor pattern 270. The electrons moved toward the first electrode 240 may be accumulated in the channel semiconductor pattern 270 due to the high potential barrier of the dielectric layer 250. As a result, the first electrode 240, the channel semiconductor pattern 270, and the dielectric layer 250 interposed therebetween may function as the MOSCAP during the accumulation operation of the photo-charges.

Correspondingly, holes generated in the channel semiconductor pattern 270 as a result of incident light move into the second electrode 290. Because the channel semiconductor pattern 270 has a valence band energy level that is lower than the valence band energy level of the photoelectric conversion layer 280, holes generated in the photoelectric conversion layer 280 in response to incident light may be blocked from flowing into the channel semiconductor pattern 270.

Thereafter, if a voltage (e.g., a ground voltage (0V) or a negative voltage) that is lower than the voltage of the contact node 260 is applied to the first electrode 240, the electrons accumulated in the channel semiconductor pattern 270 may move to the contact node 260 through the channel semiconductor pattern 270, and the electrons moved in the contact node 260 may move to the floating diffusion region 220 through the via-plug 230 connected to the contact node 260. Since the channel semiconductor pattern 270 is formed of the material of which the electron mobility is higher than that of the organic photoelectric conversion layer 280, the electrons generated in the organic photoelectric conversion layer 280 may be quickly moved to the e floating diffusion region 220 through the channel semiconductor pattern 270. As a result, the electrons generated in the organic photoelectric conversion layer 280 may be accumulated in the floating diffusion region 220. A gate bias of the amplification element may be changed in proportion to the amount of the electrons accumulated in the floating diffusion region 220, so a source potential of the amplification element may be changed. At this time, if the selection element is turned-on, a signal corresponding to the electrons may be sensed through the output line V out.

An image sensor according to example embodiments of the inventive concepts may include a storage transfer element which includes the first electrode 240, the channel semiconductor pattern 270, and the dielectric layer 250 interposed between the first electrode 240 and the channel semiconductor pattern 270. The storage transfer element and the photoelectric conversion element (i.e., the organic photoelectric conversion layer 280) are disposed on the interlayer insulating layer 225. According to embodiments of the inventive concepts, since the conduction band energy level of the channel semiconductor pattern 270 is lower than the conduction band energy level of the organic photoelectric conversion layer 280, the electrons generated in the organic photoelectric conversion layer 280 may move freely to the channel semiconductor pattern 270 and may be then accumulated in the channel semiconductor pattern 270. As a result, an effective movement distance of the photo-charges (i.e., the electrons generated in the organic photoelectric conversion layer 280) for accumulation may be reduced, which may effectively reduce a dark current caused during capture of charges. In addition, since the channel semiconductor pattern 270 is formed of a material having an electron mobility that is higher than the electron mobility of the organic photoelectric conversion layer 280, the electrons accumulated in the channel semiconductor pattern 270 may move quickly into the floating diffusion region 220. Thus, a complete correlated double sampling operation may be performed to remove reset noise (or kTC noise). Moreover, the channel semiconductor patterns 270 of the unit pixels P may be isolated from each other by the isolation insulating pattern 275, and thus it is possible to reduce or minimize crosstalk that may be caused by a coupling effect of adjacent unit pixels during the accumulation and transfer operations of the photo-charges. The performance of the image sensor may thereby be improved.

FIGS. 6 to 12 are cross-sectional views corresponding to the line I-I' of FIG. 3 that illustrate a method of fabricating an image sensor recording to an example embodiment of the inventive concepts.

Figure 6:
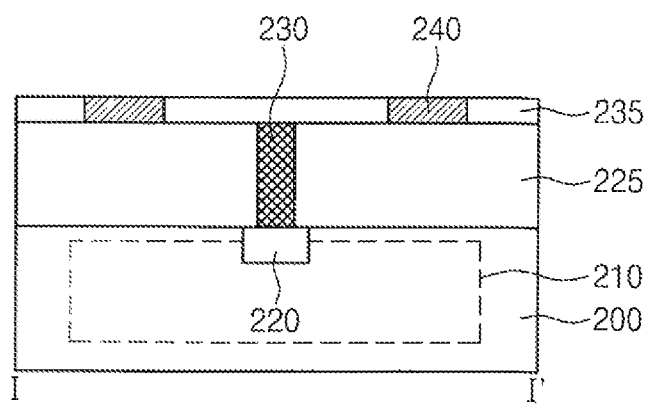
FIGS. 6 to 12 are cross-sectional views corresponding to the line of FIG. 3 to illustrate a method of fabricating an image sensor according to an embodiment of the inventive concepts.

Referring to FIGS. 3 and 6, a pixel circuit 210 and a floating diffusion region 220 may be formed in a substrate 200. The substrate 200 may be a silicon substrate, a silicon-germanium substrate, or a compound semiconductor substrate. However, the inventive concepts are not limited thereto. The substrate 200 may be doped with, for example, P-type dopants. The pixel circuit 210 may include the reset element, the amplification element, and the selection element which are described with reference to FIG. 2. These elements may be formed by a general CMOS fabricating process. The floating diffusion region 220 may be formed by injecting N-type dopants into the substrate 200. The floating diffusion region 220 may correspond to the detection element described with reference to FIG. 2.

An interlayer insulating layer 225 may be formed on the substrate 200. The interlayer insulating layer 225 may be single-layered or multi-layered. The interlayer insulating layer 225 may include at least one of an oxide (e.g., silicon oxide), a nitride (e.g., silicon nitride), or an oxynitride (e.g., silicon oxynitride). A plug 230, which is connected to the floating diffusion region 220, may be formed to penetrate the interlayer insulating layer 225. In an example embodiment, the via-plug 230 may have a circular cylinder shape or a polygonal pillar shape. However, the inventive concepts are not limited to the shape of the via-plug 230. For example, the via-plug 230 may include at least one of a metal material (e.g., copper, aluminum, or tungsten) and silicon heavily doped with dopants.

A first electrode 240 may be formed on the interlayer insulating layer 225. A horizontal section of the first electrode 240 may have, but not limited to, a circular ring shape or a polygonal ring shape. In an example embodiment, the horizontal section of the first electrode 240 may have a quadrilateral ring shape. In an example embodiment, a conductive layer may be deposited on the interlayer insulating layer 225, and the deposited conductive layer may be patterned to form the first electrode 240. In an example embodiment, the conductive layer may include a metal material such as aluminum or tungsten. In other embodiments, the conductive layer may include at least one of indium tin oxide (ITO), indium zinc oxide (IZO), zinc oxide (ZnO), tin oxide ($SnO_2$), antimony-doped tin oxide (ATO), aluminum-doped zinc oxide (AZO), gallium-doped zinc oxide (GZO), titanium oxide ($TiO_2$), and fluorine-doped tin oxide (FTO). The conductive layer may be formed by a deposition process such as a chemical vapor deposition (CVD) process or a physical vapor deposition (PVD) process.

A lower dielectric layer 235 may be formed on the interlayer insulating layer 225 on which the first electrode 240 is formed. In an example embodiment, an insulating layer may be formed to cover the first electrode 240, and the insulating layer may be planarized until a top surface of the first electrode 240 is exposed, thereby forming the lower dielectric layer 235. A top surface of the lower dielectric layer 235 may be substantially coplanar with the top surface of the first electrode 240. In an example embodiment, the lower dielectric layer 235 may include silicon oxide, silicon nitride, or silicon oxynitride. In other embodiments, the lower dielectric layer 235 may include a high-k dielectric layer such as a hafnium oxide layer or an aluminum oxide layer. The lower dielectric layer 235 may be formed by a CVD process, a PVD process, or an atomic layer deposition (ALD) process. Alternatively, the lower dielectric layer 235 may be formed, and the first electrode 240 may be then formed in the lower dielectric layer 235.

Figure 7:
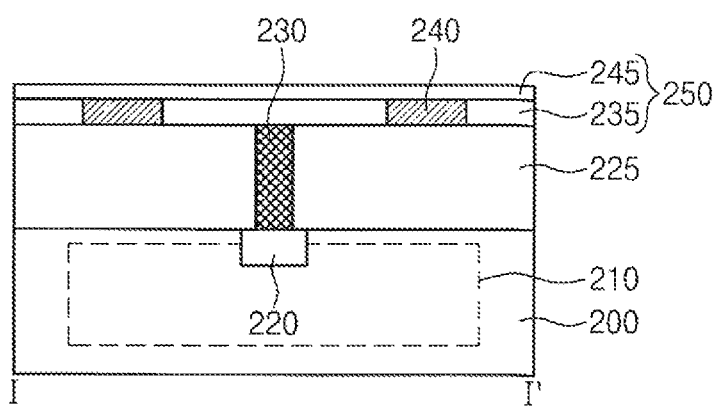

Referring to FIGS. 3 and 7, an upper dielectric layer 245 covering the top surface of the first electrode 240 may be formed on the lower dielectric layer 235. A thickness of the upper dielectric layer 245 may be smaller than a thickness of the first electrode 240 (or a thickness of the lower dielectric layer 235). The upper dielectric layer 245 may include the same material as the lower dielectric layer 235. The lower dielectric layer 235 and the upper dielectric layer 245 may constitute a dielectric layer 250.

Figure 8:
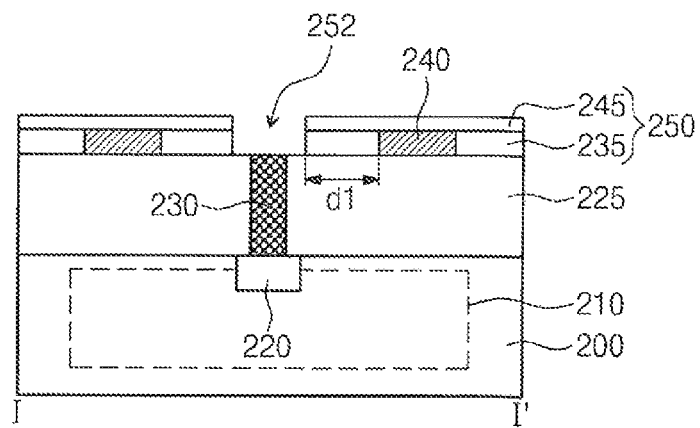
Figure 9:
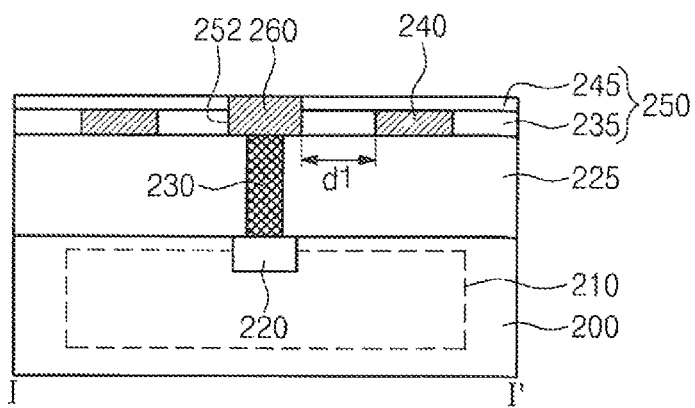

Referring to FIGS. 3, 8, and 9, a contact node 260 which is connected to the via-plug 230 may be formed in the dielectric layer 250. In an example embodiment, a first opening 252 may be formed to penetrate the dielectric layer 250. The first opening 252 may expose the top surface of the via-plug 230. A mask pattern (not shown) may be formed on the dielectric layer 250, and the dielectric layer 250 may be etched using the mask pattern as an etch mask to form the first opening 252. Next, the contact node 260 may be formed by filling the first opening 252 with a conductive material. A top surface of the contact node 260 may be substantially coplanar with a top surface of the dielectric layer 250. In other words, the contact node 260 may be thicker than the first electrode 240. When viewed from a plan view, the contact node 260 may be surrounded by the first electrode 240 with the dielectric layer 250 interposed therebetween. A horizontal section of the contact node 260 may have a circuit shape or a polygonal shape. In an example embodiment, the horizontal section of the contact node 260 may have a quadrilateral shape. In this case, each of inner sidewalls of the first electrode 240 may face each of sidewalls of the contact node 260. The inner sidewall of the first electrode 240 and the sidewall of the contact node 260, which face each other, may be spaced apart from each other by a first distance d1. The contact node 260 may be formed of the same material as the first electrode 240.

Figure 10:
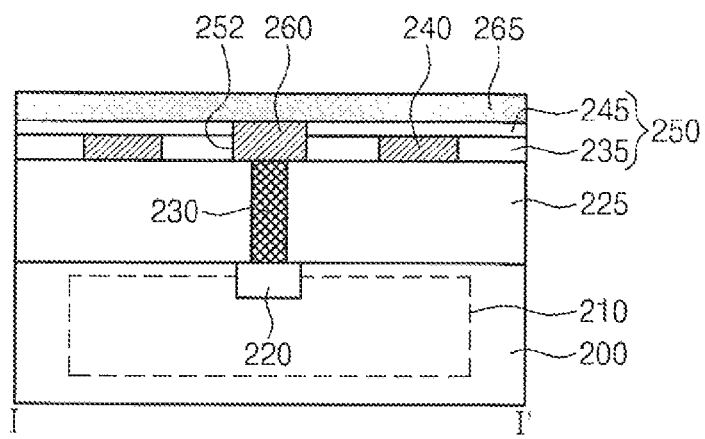

Referring to FIGS. 3 and 10, a channel semiconductor layer 265 covering the top surface of the contact node 260 may be formed on the dielectric layer 250. The channel semiconductor layer 265 may be formed a material of which electron mobility is higher than that of an organic photoelectric conversion layer 280 to be described later. Also, the channel semiconductor layer 265 may be formed of the material of a conduction band energy level and a valence band energy level are lower than a conduction band energy level and a valence band energy level of the organic photoelectric conversion layer 280, respectively. In an example embodiment, the channel semiconductor layer 265 may include a transparent conductive oxide semiconductor material such as InGaZnO, ZnO, or $SnO_2$. In other embodiments, the channel semiconductor layer 265 may include a II-VI group compound semiconductor material such as CdSe or CdS. In still other embodiments, the channel semiconductor layer 265 may include a semiconductor material such as MoS$_2$. The channel semiconductor layer 265 may have a high electron mobility of 200 cm$^2$/Vs to 900 cm$^2$/Vs, and a transmittance of 80% or more in a visible wavelength band. The channel semiconductor layer 265 may be formed by, for example, a CVD process, a PVD process, or an ALD process.

Figure 11:
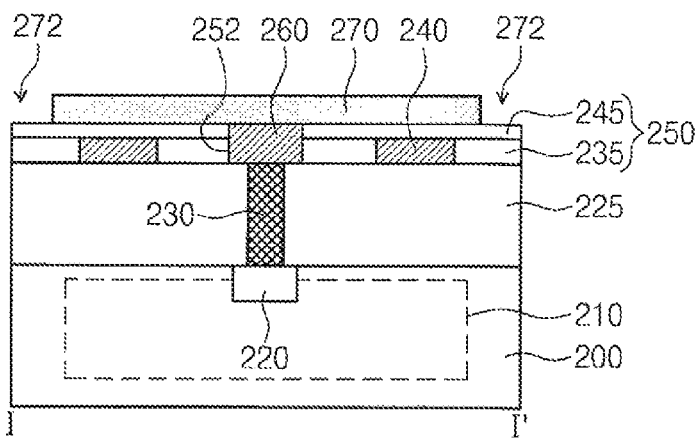

Referring to FIGS. 3 and 11, the channel semiconductor layer 265 of FIG. 10 may be patterned to form a channel semiconductor pattern 270. A mask pattern (not shown) may be formed on the channel semiconductor layer 265, and the channel semiconductor layer 265 may be etched using the mask pattern as an etch mask, thereby forming the channel semiconductor pattern 270. At the same time, a second opening 272 that exposes the dielectric layer 250 may be formed between the channel semiconductor patterns 270 of unit pixels P. The second opening 272 may define sidewalls of the channel semiconductor pattern 270. In an example embodiment, a horizontal section of the channel semiconductor pattern 270 may have a quadrilateral shape. However, the inventive concepts are not limited to the shape of the horizontal section of the channel semiconductor pattern 270. When viewed from a plan view, the channel semiconductor pattern 270 may cover the contact node 260 and the first electrode 240. An area of a top surface of the channel semiconductor pattern 270 may be greater than a sum of areas of the top surfaces of the contact node 260 and the first electrode 240.

Figure 12:
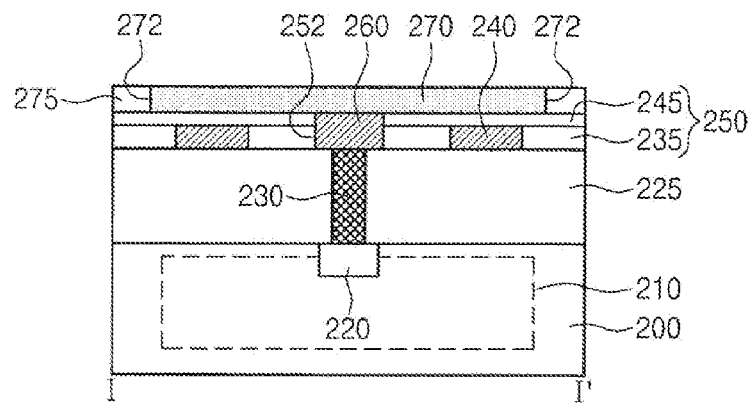

Referring to FIGS. 3 and 12, an isolation insulating pattern 275 may be formed in the second opening 272. In an example embodiment, an isolation insulating layer may be formed to fill the second opening 272, and the isolation insulating layer may be planarized until the top surface of the channel semiconductor pattern 270 is exposed, thereby forming the isolation insulating pattern 275. The isolation insulating pattern 275 may have a grid shape when viewed from a plan view. In other words, the isolation insulating pattern 275 may includes a plurality of rows extending in a first direction and a plurality of columns extending in a second direction intersecting the first direction. The isolation insulating pattern 275 may electrically isolate the channel semiconductor patterns 270 of adjacent unit pixels P from each other. The isolation insulating layer may include at least one of an oxide (e.g., silicon oxide), a nitride (e.g., silicon nitride), or an oxynitride (e.g., silicon oxynitride).

Referring again to FIGS. 3 and 4, an organic photoelectric conversion layer 280 may be formed on the substrate 200 having the isolation insulating pattern 275. The organic photoelectric conversion layer 280 may cover the plurality of unit pixels P. In an example embodiment, the organic photoelectric conversion layer 280 may include a mixed organic material of an electron donating organic material and an electron accepting organic material. In other words, the organic photoelectric conversion layer 280 may include a mixed organic material of an N-type organic material corresponding to the electron donating organic material and a P-type organic material corresponding to the electron accepting organic material. Thus, the organic photoelectric conversion layer 280 may have a bulk hetero junction-type PN junction structure. The organic photoelectric conversion layer 280 may selectively absorb light of a specific wavelength band to cause the photoelectric conversion. The organic photoelectric conversion layer 280 may be applied to a blue pixel, a green pixel, and/or a red pixel. In an example embodiment, the organic photoelectric conversion layer 280 may include a mixture of coumarin 30:C60 and tris(8-hydroxyquinolinato)aluminum (Alq3), which is used as an organic material causing the photoelectric conversion of a blue wavelength band. In other embodiments, the organic photoelectric conversion layer 280 may include a mixture of boron subphthalocyanine chloride (SubPc) and N,-N dimethyl quinacridone (DMQA) dibutyl-substituted dicyanovinyl-terthiophene (DCV3T), which is used as an organic material causing the photoelectric conversion of a green wavelength band. In still other embodiments, the organic photoelectric conversion layer 280 may include a mixture of zinc phthalocyanine (ZnPc), titanyl-oxo-phthalocyanine (TiOPc), and Alq3, which is used as an organic material causing the photoelectric conversion of a red wavelength band.

Subsequently, a second electrode 290 may be formed on the organic photoelectric conversion layer 280. The second electrode 290 may be formed of a transparent conductive oxide. For example, the second electrode 290 may include at least one selected from a group consisting of indium tin oxide (ITO), indium zinc oxide (IZO), zinc oxide (ZnO), tin oxide (SnO$_2$), antimony-doped tin oxide (ATO), aluminum-doped zinc oxide (AZO), gallium-doped zinc oxide (GZO), titanium oxide (TiO$_2$), and fluorine-doped tin oxide (FTO).

Figure 13:
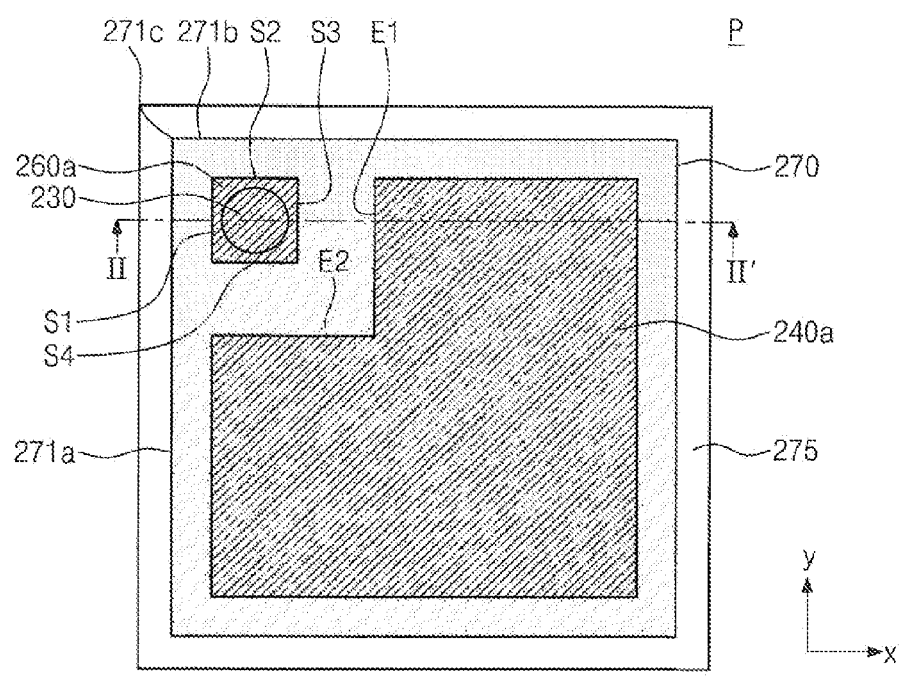
FIG. 13 illustrates a plan view of an image sensor according to another example embodiment of the inventive concepts.
Figure 14:
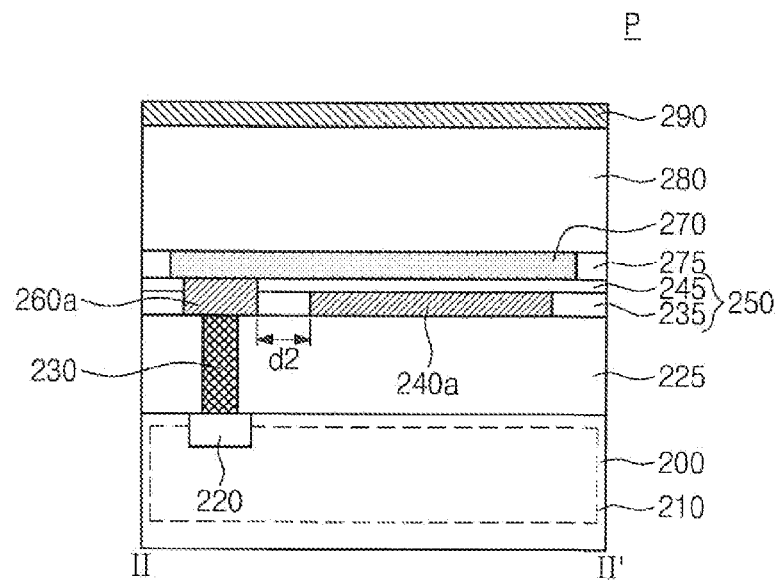
FIG. 14 is a cross-sectional view taken along a line II-II' of FIG. 13.
Figure 15:
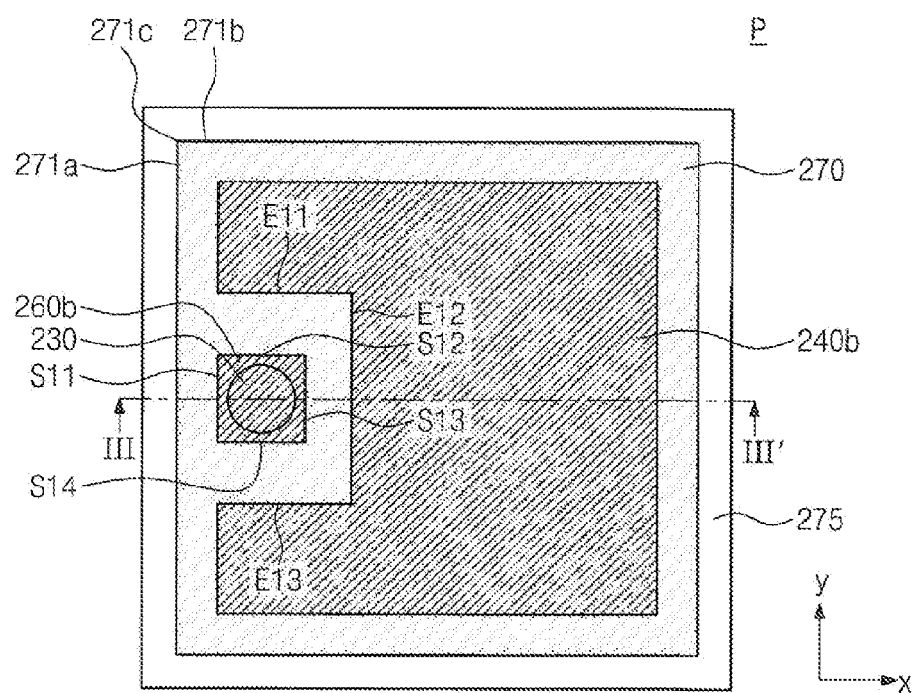
FIG. 15 illustrates a plan view of an image sensor according to still another example embodiment of the inventive concepts.
Figure 16:
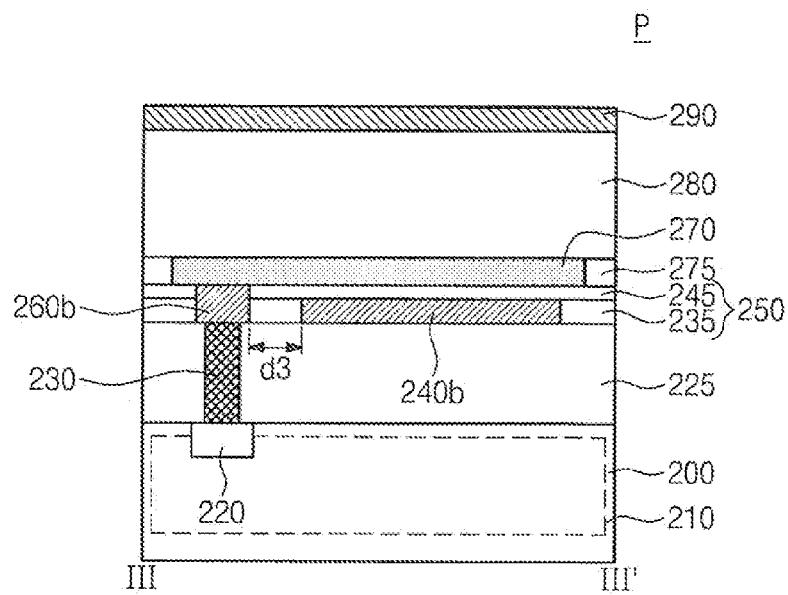
FIG. 16 is a cross-sectional view taken along a line III-III' of FIG. 15.

FIGS. 13 and 15 are enlarged plan views of a unit pixel of FIG. 3 to illustrate an image sensor according to another example embodiment of the inventive concepts. FIGS. 14 and 16 are cross-sectional views taken along a line II-II' of FIG. 13 and a line III-III' of FIG. 15, respectively. In the present example embodiment, the descriptions to the same elements as in the example embodiments of FIGS. 3 and 4 will be omitted or mentioned briefly for the purpose of ease and convenience in explanation. In other words, differences between the present example embodiment and the example embodiment of FIGS. 3 and 4 will be mainly described hereinafter.

Referring to FIGS. 13 and 14, a contact node 260a and a first electrode 240a may be disposed on the interlayer insulating layer 225. The channel semiconductor pattern 270 may be disposed on the contact node 260a and the first electrode 240a. The contact node 260a may be connected to the via-plug 230, and the channel semiconductor pattern 270 may be connected to the contact node 260a. In an example embodiment, a horizontal section of the channel semiconductor pattern 270 may have a quadrilateral shape. In this case, the channel semiconductor pattern 270 may have edges 271a and 271b and corners 271c between the edges 271a and 271b. When viewed from a plan view, the contact node 260a may be adjacent to the corner 271c between the edges 271a and 271b of the channel semiconductor pattern 270.

A horizontal section of the contact node 260a may have a circular shape or a polygonal shape, like the contact node 260 of FIGS. 3 and 4. In an example embodiment, the horizontal section of the contact node 260a may have a quadrilateral shape. In this case, the contact node 260a may have first and second sidewalls S1 and S2 respectively adjacent to the edges 271a and 271b of the channel semiconductor pattern 270, and third and fourth sidewalls S3 and S4 respectively opposite to the first and second sidewalls S1 and S2. The first electrode 240a may surround some of the sidewalls of the contact node 260a with a constant distance therebetween. In an example embodiment, in the event that the contact node 260a has the first to fourth sidewalls S1 to S4 described above, the first electrode 240a may surround the third and fourth sidewalls S3 and S4 of the contact node 260a. In other words, the first electrode 240a may include a first sidewall E1 facing the third sidewall S3 of the contact node 260a and a second sidewall E2 facing the fourth sidewall S4 of the contact node 260a. The sidewalls facing each other (e.g., the third sideman S3 of the contact 260*a* and the first sidewall E1 of the first electrode 240*a*) may be spaced apart from each other by a second distance d2.

The contact node 260*a* may be thicker than the first electrode 240*a*. An area of the top surface of the contact node 260*a* may be smaller than that of the top surface of the first electrode 240*a*. The area of the contact node 260*a*, the area of the first electrode 240*a*, and the distance d2 therebetween may be variously modified as necessary. The contact node 260*a* and the first electrode 240*a* may include the same materials as the contact node 260 and the first electrode 240 described with reference to FIGS. 3 and 4, respectively.

Referring to FIGS. 15 and 16, a contact node 260*b* and a first electrode 240*b* may be disposed on the interlayer insulating layer 225. The channel semiconductor pattern 270 may be disposed on the contact node 260*h* and the first electrode 240*b*. The contact node 260*b* may be connected to the via-plug 230, and the channel semiconductor pattern 270 may be connected to the contact node 260*b*. In an example embodiment, a horizontal section of the channel semiconductor pattern 270 may have a quadrilateral shape like FIGS. 13 and 14. When viewed from a plan view, the contact node 260*b* may be adjacent to one edge 271*a* of the channel semiconductor pattern 270 and may be disposed between adjacent corners 271*c* of the channel semiconductor pattern 270.

A horizontal section of the contact node 260*b* may have a circular shape or a polygonal shape, like the contact node 260 of FIGS. 3 and 4. In an example embodiment, the horizontal section of the contact node 260*b* may have a quadrilateral shape. In this case, the contact node 260*b* may have a first sidewall S11 adjacent to the one edge of the channel semiconductor pattern 270, second and fourth sidewalk S12 and S14 adjacent to the first sidewall S11, and a third sidewall S13 opposite to the first sidewall S11. The first electrode 240*b* may surround some of the sidewalls of the contact node 260*a* with a constant distance therebetween. In an example embodiment, in the event that the contact node 260*b* has the first to fourth sidewalls S11 to S14 described above, the first electrode 240*b* may surround the second to fourth sidewalk S12 to S14 of the contact node 260*b*. In other words, the first electrode 240*b* may include a first sidewall E11 facing the second sidewall S12 of the contact node 260*b*, a second sidewall E12 facing the third sidewall S13 of the contact node 260*b*, and a third sidewall E13 facing the fourth sidewall S14 of the contact node 260*b*. The sidewalls facing each other (e.g., the third sidewall S13 of the contact node 260*b* and the second sidewall E12 of the first electrode 240*b*) may be spaced apart from each other by a third distance d3.

The shapes and arrangement relations of the first electrodes 240, 240*a*, and 240*b* and the contact nodes 260, 260*a*, and 260*b* of FIGS. 3, 4, and 13 to 16 may affect a full well capacity, a collection efficiency, and/or a transfer efficiency of the image sensors. In an example embodiment, as an area of the sidewall of the contact node 260, 260*a*, or 260*b* surrounded by the first electrode 240, 240*a*, or 240*b* increases, the connection efficiency of the image sensor may increase. In other embodiments, as the area of the first electrode 240, 240*a*, or 240*b* increases when the channel semiconductor pattern 270 has a predetermined area, the full well capacity of the image sensor may increase.

Figure 17:
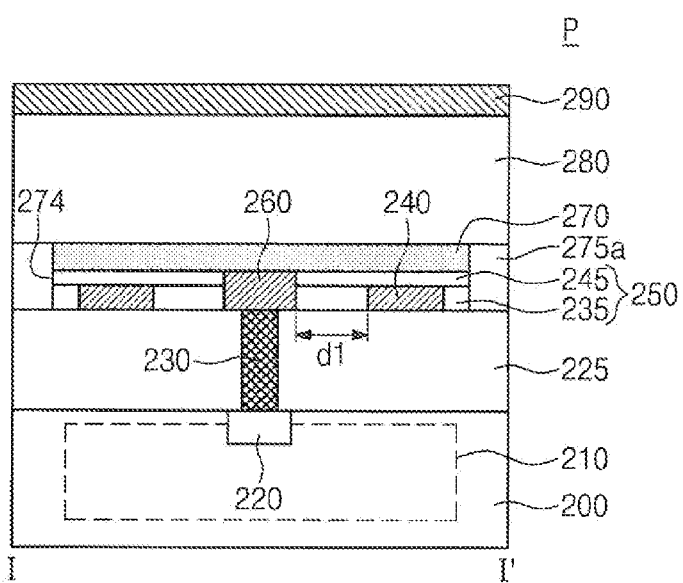
FIG. 17 is a cross-sectional view taken along the line I-I' of FIG. 3 to illustrate an image sensor according to still another example embodiment of the inventive concepts.

FIG. 17 is a cross-sectional view taken along the line I-I' of FIG. 3 to illustrate an image sensor according to still another example embodiment of the inventive concepts. In the present example embodiment, the descriptions to the same elements as in the example embodiment of FIGS. 3 and 4 will be omitted or mentioned briefly for the purpose of ease and convenience in explanation. In other words, differences between the present example embodiment and the example embodiment of FIGS. 3 and 4 will be mainly described hereinafter.

Referring to FIGS. 3 and 17, an isolation insulating pattern 275*a* may be disposed on the interlayer insulating layer 225. The isolation insulating pattern 275*a* may be in contact with sidewalls of a dielectric layer 250 and sidewalls of the channel semiconductor pattern 270 and may surround the dielectric layer 250 and the channel semiconductor pattern 270. The second opening 272 of FIG. 1I may extend into the dielectric layer 250 so as to be formed into a third opening 274 exposing the top surface of the interlayer insulating layer 225. The isolation insulating pattern 275*a* may be formed by filling the third opening 274 with an isolation insulating material.

The isolation insulating pattern 275*a* may be formed of the same material of the isolation insulating pattern 275 of FIG. 4. In addition, the isolation insulating pattern 275*a* may have the same planar shape (e.g., the grid shape) as the isolation insulating pattern 275 of FIG. 4. The isolation insulating pattern 275*a* may electrically isolate the channel semiconductor pattern 270 of one unit pixel P from the channel semiconductor patterns 270 of other unit pixels P adjacent to the one unit pixel P. The isolation insulating pattern 275*a* may extend into the dielectric layer 250, so the dielectric layer 250 of the unit pixel P may have sidewalls vertically aligned with the sidewalls of the channel semiconductor pattern 270.

Even though not shown in the drawings, the shapes and arrangement relation of the first electrode 240 and the contact node 260 of FIG. 17 may be variously modified like the shapes and the arrangement relation of the first electrodes 240*a* and 240*b* and the contact nodes 260*a* and 260*b* of FIGS. 13 to 16.

Figure 18:
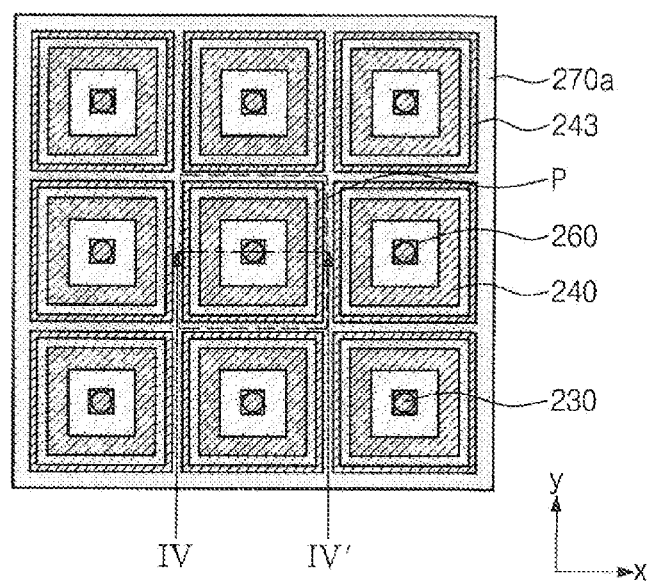
FIG. 18 illustrates a plan view of an active pixel sensor array of an image sensor according to still another example embodiment of the inventive concepts.
Figure 19:
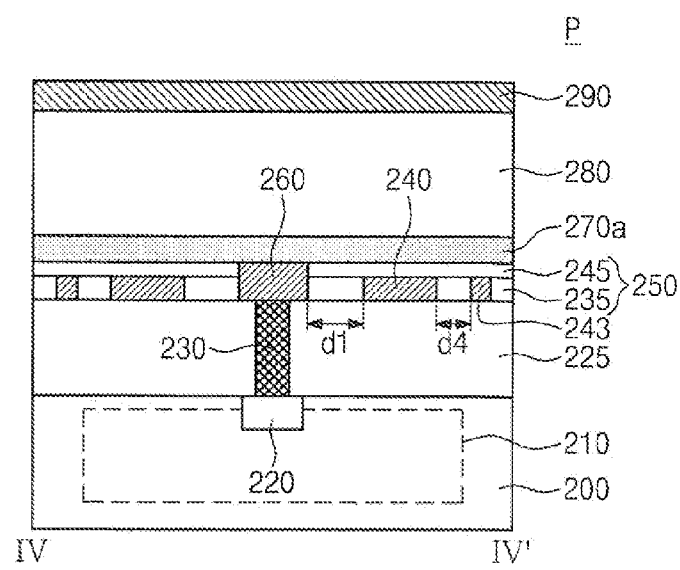
FIG. 19 is a cross-sectional view taken along a line IV-IV' of FIG. 18.

FIG. 18 illustrates a plan view of an active pixel sensor array of an image sensor according to still another example embodiment of the inventive concepts, and FIG. 19 is a cross-sectional view taken along a line IV-IV' of FIG. 18. In an image sensor of FIGS. 18 and 19, the isolation insulating pattern may be omitted and a guard electrode may be added. Other elements of the image sensor of FIGS. 18 and 19 may be the same as corresponding elements of the image sensor of FIGS. 3 and 4. In the present example embodiment, the descriptions to the same elements as in the example embodiment of FIGS. 3 and 4 will be omitted or mentioned briefly for the purpose of ease and convenience in explanation.

Referring to FIGS. 18 and 19, the contact node 260 connected to the via-plug 230 and the first electrode 240 surrounding the contact node 260 may be disposed on the interlayer insulating layer 225. In addition, a guard electrode 243 may be disposed on the interlayer insulating layer 225. The guard electrode 243 may surround an entire outer sidewall of the first electrode 240 with a constant distance therebetween. A shape of a horizontal section of the guard electrode 243 may correspond to that of the first electrode 240. In an example embodiment, if the horizontal section of the first electrode 240 has the quadrilateral ring shape, the horizontal section of the guard electrode 243 may also have a quadrilateral ring shape. In this case, the outer sidewall of the first electrode 240 and an inner sidewall of the guard electrode 243 which face each other may be spaced apart from each other by a fourth distance d4. A thickness of the guard electrode 243 may be substantially similar to that of the first electrode 240. The guard electrode 243 may be formed of the same material of the first electrode 240. The guard electrode 243 may isolate the unit, pixels P from each other during operation of the image sensor. In other words, the guard electrode 243 may obstruct the photo-charges e.g., electrons) generated in the organic photoelectric conversion layer 280 from moving to neighboring unit pixels P. This function of the guard electrode 243 may be realized by applying a negative voltage to the guard electrode 243. Even though not shown in the drawings, a metal interconnection connected to the guard electrode 243 may be disposed in the interlayer insulating layer 225, so a desired voltage may be applied to the guard electrode 243 through this metal interconnection. The guard electrode 243 may separate the unit pixels P from each other. A lower dielectric layer 235 may be disposed on the interlayer insulating layer 225. The lower dielectric layer 235 may cover sidewalls of a lower portion of the contact node 260, sidewalls of the first electrode 240, and sidewalls of the guard electrode 243. A top surface of the lower dielectric layer 235 may be disposed at a substantially same height as a top surface of the first electrode 240 and a top surface of the guard electrode 243. An upper dielectric layer 245 exposing the top surface of the contact node 260 may be disposed on the lower dielectric layer 235, and a channel semiconductor pattern 270a being in contact with the contact node 260 may be disposed on the upper dielectric layer 245. Since the isolation insulating pattern is omitted, the channel semiconductor pattern 270a may have as plate shape that covers a plurality of unit pixels P.

According to some example embodiments, the guard electrode 243 and the first electrode 240 may be formed at the same time. In more detail, a conductive layer may be deposited on the interlayer insulating layer 225 having the via-plug 230, and the deposited conductive layer may be patterned to form the first electrode 240 and the guard electrode 243 on the interlayer insulating layer 225.

Even though not shown in the drawings, the shapes and the arrangement relation of the first electrode 240 and the contact node 260 of FIGS. 18 and 19 may be variously modified like the shapes and the arrangement relations of the first electrodes 240a and 240b and the contact nodes 260a and 260b of FIGS. 13 to 16.

Figure 20:
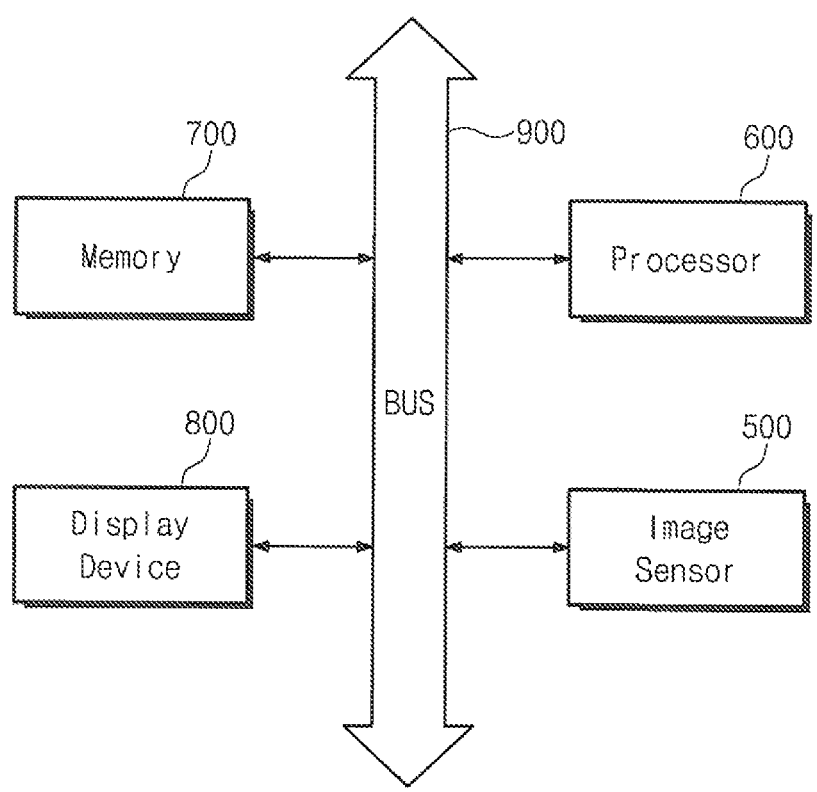
FIG. 20 illustrates a schematic block diagram of an electronic device including an image sensor according to example embodiments of the inventive concepts.

FIG. 20 illustrates a schematic block diagram of an electronic device including an image sensor according to example embodiments of the inventive concepts.

An electronic device may be a digital camera or a mobile device. Referring to FIG. 20, a digital camera system may include an image sensor 500, a processor 600, a memory device 700, a display device 800, and a system bus 900. The image sensor 500 may capture external image information in response to control signals of the processor 600. The image sensor 500 may include at least one of the image sensors of the aforementioned embodiments of the inventive concepts. The processor 600 may store the captured image information in the memory device 700 through the system bus 900. The process 600 may display the image information stored in the memory device 700 on the display device 800.

Figure 21:
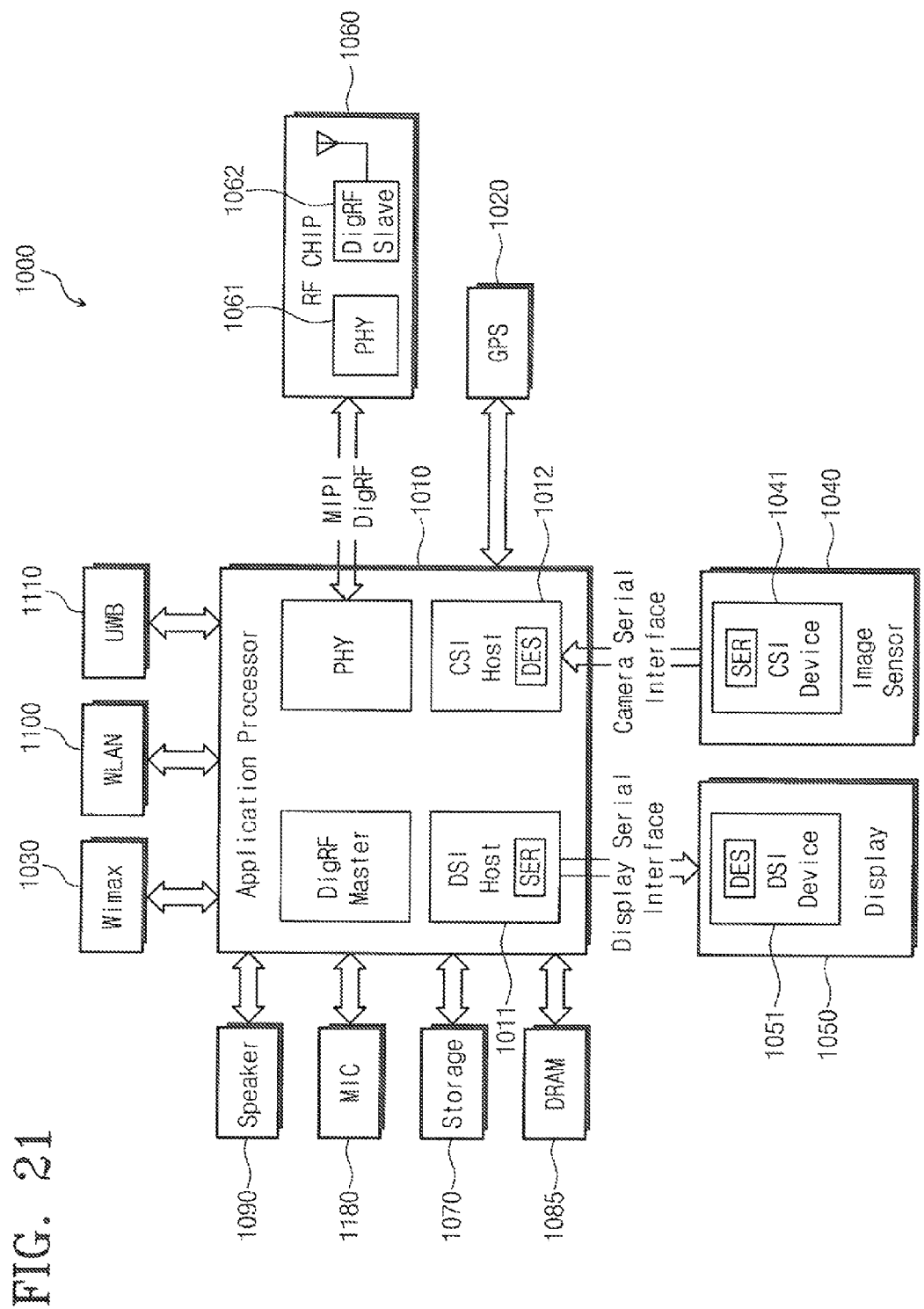
FIG. 21 illustrates a schematic block diagram i of an electronic system including an image sensor according to example embodiments of the inventive concepts.
Figure 22:
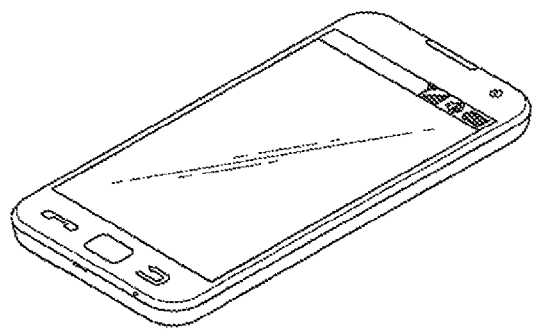
FIGS. 22 to 26 illustrate examples of multimedia devices implemented with image sensors according to example embodiments of the inventive concepts.
Figure 23:
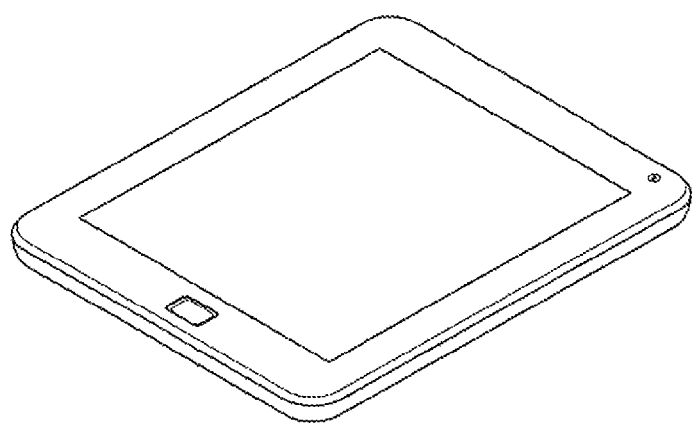
Figure 24:
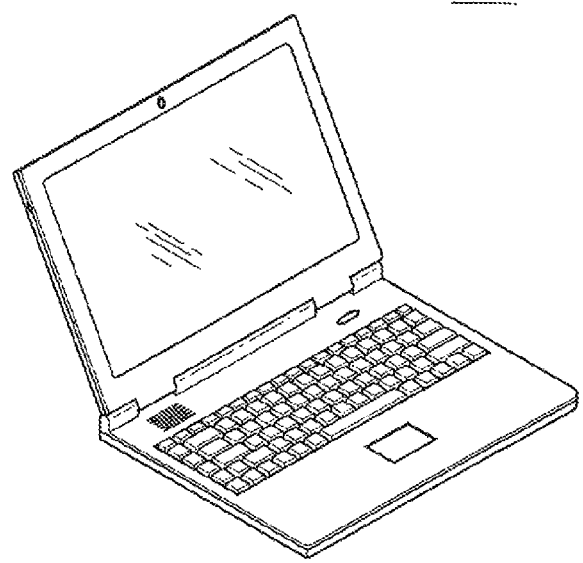
Figure 25:
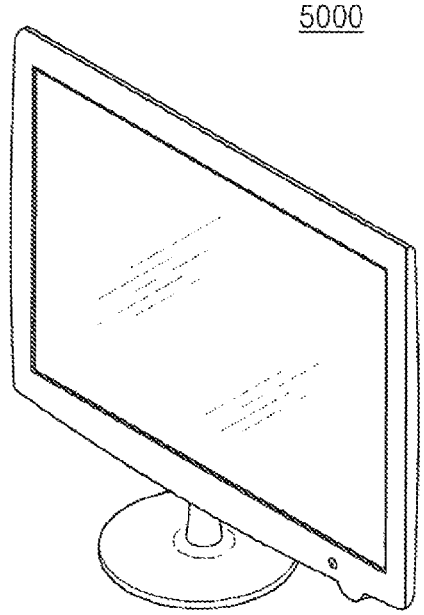
Figure 26:
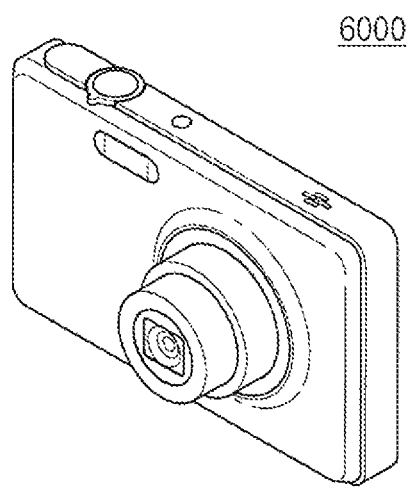

FIG. 21 illustrates a schematic block diagram of an electronic system including an image sensor according to example embodiments of the inventive concepts.

Referring to FIG. 21, an electronic system 1000 may be realized as a data processing device capable of using or supporting the mobile industry processor interface (MIPI), e.g., a portable phone, a personal digital assistant (PDA), a portable multimedia player (PMP), or a smart phone.

The electronic system 1000 may include an application processor 1010, an image sensor 1040, and a display device 1050. The image sensor 1040 may be one of the image sensors according to the aforementioned embodiments of the inventive concepts.

A camera serial interface (CSI) host 1012 realized in the application processor 1010 may serially communicate with a CSI device 1041 of the image sensor 1040 through a camera serial interface (CSI). For example, an optical de-serializer may be realized in the CSI host 1012, and an optical serializer may be realized in the CSI device 1041.

A display serial interface (DSI) host 1011 realized in the application processor 1010 may serially communicate with a DSI device 1051 of the display device 1050 through a display serial interface (DSI). For example, an optical serializer may be realized in the DSI host 1011, and an optical de-serializer may be realized in the DST device 1051.

The electronic system 1000 may further include a radio frequency (RF) chip 1060 capable of communicating with the application processor 1010. A PITY 1013 of the electronic system 1000 may exchange data with a PHY 1061 of the RF chip 1060 according to MIPI DigRF.

The electronic system 1000 may further include a global positioning system (GPS) 1020, a storage 1070, a microphone 1080, a dynamic random access memory (DRAM) 1085, and a speaker 1090. The electronic system 1000 may communicate using Wimax 1030, WLAN 1100, and UWB 1110.

FIGS. 22 to 26 illustrate examples of multimedia devices implemented with image sensors according to example embodiments of the inventive concepts.

The image sensor according to the example embodiments of the inventive concepts may be applied to various multimedia devices. For example, the image sensor of the example embodiments of the inventive concepts may be applied to a mobile or smart phone 2000 illustrated in FIG. 22 and/or a tablet or smart tablet 3000 illustrated in FIG. 23. In addition, the image sensor according to the aforementioned example embodiments may be applied to a notebook computer 4000 illustrated in FIG. 24 and/or a television or smart television 5000 illustrated in FIG. 25. Furthermore, the image sensor according to the aforementioned example embodiments may be applied to a digital camera or camcorder 6000 illustrated in FIG. 26.

According to example embodiments of the inventive concepts, the image sensor may include the storage transfer element which includes the first electrode, the channel semiconductor pattern, and the dielectric layer interposed between the first electrode and the channel semiconductor pattern. The storage transfer element and the photoelectric conversion element (i.e., the photoelectric conversion layer) are disposed on the interlayer insulating layer. According to example embodiments of the inventive concepts, since the conduction band energy level of the channel semiconductor pattern is lower than the conduction band energy level of the photoelectric conversion layer, the electrons generated in the photoelectric conversion layer may move freely to the channel semiconductor pattern so as to be accumulated in the channel semiconductor pattern. As a result, the effective movement distance of the photo-charges between the photoelectric conversion layer and the floating diffusion region may be reduced to effectively reduce a dark current caused during capture of charges. In addition since the channel semiconductor pattern is formed of the material of which the electron mobility is higher than that of the photoelectric conversion layer, the electrons generated in the photoelectric conversion layer may be quickly moved to the floating diffusion region. Thus, the complete correlated double sampling operation may be performed to remove the reset noise (or the kTC noise). Moreover, the channel semiconductor patterns of the unit pixels may be isolated from each other by the isolation insulating pattern, and thus it is possible to reduce or minimize the crosstalk caused by the coupling effect of adjacent unit pixels during the accumulation and transfer operations of the photo-charges. In other words, the performance of the image sensor may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
    a substrate including a floating diffusion region and a pixel circuit;
    an interlayer insulating layer on the substrate;
    a contact node and a first electrode on the interlayer insulating layer;
    a dielectric layer on a top surface of the first electrode;
    a channel semiconductor pattern on the dielectric layer and connected to the contact node; and
    a photoelectric conversion layer on the channel semiconductor pattern,
    wherein the channel semiconductor pattern includes a semiconductor material having an electron mobility that is higher than an electron mobility of the photoelectric conversion layer; and
    wherein the image sensor further comprises an isolation insulating pattern on the dielectric layer, wherein the isolation insulating pattern is in contact with sidewalls of the channel semiconductor pattern and surrounds the channel semiconductor pattern when viewed from a plan view.

2. The image sensor of claim 1, wherein a conduction band energy level of the channel semiconductor pattern is lower than a conduction band energy level of the photoelectric conversion layer, and wherein a valence band energy level of the channel semiconductor pattern is lower than a valence band energy level of the photoelectric conversion layer.

3. The image sensor of claim 2, wherein the channel semiconductor pattern includes at least one of InGaZnO, ZnO, $SnO_2$, CdSe, CdS, or $MoS_2$.

4. The image sensor of claim 1, further comprising:
    a via-plug disposed in the interlayer insulating layer;
    wherein the via-plug electrically connects the floating diffusion region to the contact node.

5. The image sensor of claim 1, wherein the photoelectric conversion layer includes an electron donating organic material and an electron accepting organic material, and
    wherein the organic materials comprise a bulk hetero junction-type PN junction structure.

6. The image sensor of claim 1, wherein the contact node overlaps with a central portion of the channel semiconductor pattern, and
    wherein the first electrode surrounds an entire periphery of the contact node.

7. The image sensor of claim 1, wherein the contact node is adjacent to one edge of the channel semiconductor pattern or a corner between adjacent edges of the channel semiconductor pattern when viewed from a plan view, and
    wherein the first electrode surrounds a portion of a periphery of the contact node when viewed from a plan view.

8. The image sensor of claim 1, further comprising:
    an isolation insulating pattern disposed on the interlayer insulating layer,
    wherein the isolation insulating pattern is in contact with sidewalls of the dielectric layer and sidewalls of the channel semiconductor pattern and surrounds the dielectric layer and the channel semiconductor pattern when viewed from a plan view.

9. The image sensor of claim 1, further comprising:
    a guard electrode disposed on the interlayer insulating layer,
    wherein the guard electrode surrounds the contact node and the first electrode when viewed from a plan view, and
    wherein the dielectric layer extends between the contact node and the first electrode and between the first electrode and the guard electrode.

* * * * *